United States Patent
Prabhakara et al.

[11] Patent Number: 6,136,403
[45] Date of Patent: Oct. 24, 2000

[54] BUFFERED NITROGENATED CARBON OVERCOAT FOR DATA RECORDING DISKS AND METHOD FOR MANUFACTURING THE SAME

[75] Inventors: Chanapatna Krishnamorthy Prabhakara, Tracy; Amrik Singh Lehil, San Jose; Stella Zofia Gornicki, Livermore; Keith Samuel Goodson, San Jose; Wing Tsang Tang, Milpitas, all of Calif.

[73] Assignee: Western Digital Corporation, Irvine, Calif.

[21] Appl. No.: 09/122,195

[22] Filed: Jul. 24, 1998

Related U.S. Application Data

[62] Division of application No. 08/608,392, Feb. 28, 1996, Pat. No. 5,855,746.

[51] Int. Cl.[7] .................. B32B 9/00; G11B 5/66; G11B 5/70
[52] U.S. Cl. .................. 428/65.3; 428/694 TC; 428/65.5; 428/65.7; 428/408
[58] Field of Search .................. 428/694 TC, 408, 428/328, 65.3, 65.5, 65.7

[56] References Cited

U.S. PATENT DOCUMENTS

| | | | |
|---|---|---|---|
| 4,778,582 | 10/1988 | Howard | 204/192.15 |
| 5,045,165 | 9/1991 | Yamashita | 204/192.16 |
| 5,232,570 | 8/1993 | Haines et al. | 204/192.16 |
| 5,244,554 | 9/1993 | Yamagata et al. | 204/192.2 |
| 5,453,168 | 9/1995 | Nelson et al. | 204/192.16 |
| 5,540,957 | 7/1996 | Ueda et al. | 427/535 |
| 5,607,783 | 3/1997 | Onodera | 428/694 T |
| 5,679,431 | 10/1997 | Chen et al. | 428/65.3 |
| 5,837,357 | 11/1998 | Matsuo et al. | 428/212 |
| 5,945,191 | 8/1999 | Hwang et al. | 428/65.5 |
| 5,949,612 | 9/1999 | Gudeman et al. | 360/97.01 |

OTHER PUBLICATIONS

Dong, Li, et al., Infrared Absorpotion and Nuclear Magnetic Resonance Studies of Carbon Nitride Thin Films Prepared by Reactive Magnetron Sputtering, 1994 American Vacuum Society, J.Vac.Sci. Technol.A 12(a), Jul./Aug. 1994, pp. 1470–1473.

Mahbub R. Khan, et al., Effects of Nitrogen, Oxygen and Air on the Magnetic Properties of Sputtered CoCrTa Thin Film Recording Discs, IEEE Transactions on Magnetics, vol. 6, Nov., 1988, pp. 2985–2987.

Dong, Li, et al., Nano–Indentation Studies of Ultrahigh Strength Carbon Nitride Thin Films, 1993 American Institute of Physics, J.Appln.Phys. vol. 74(1), Jul. 1, 1993, pp. 219–223.

Eric C. Cutiongco, et al., Tribological Behavior of Amphorous Carbon Nitride Overcoats for Magnetic Thin–Film Rigid Disks, 1995.

Dong Li, et al., Composition, Structure and Tribological Properties of Amorphous Carbon Nitride Coatings, Surface and Coatings Technology, 68169 (1994), pp. 611–615.

*Primary Examiner*—Paul Thibodeau
*Assistant Examiner*—Holly C Rickman
*Attorney, Agent, or Firm*—Milad G. Shara

[57] ABSTRACT

A recording medium on a hard disk is provided that includes a magnetic data recording layer on the disk, a hydrogenated carbon buffer layer over the data recording layer, and a nitrogenated carbon overcoat layer over the hydrogenated carbon buffer layer. The composition ratios and thickness of the recording and nitrogenated carbon overcoat layers are suitably controlled to optimum ranges.

9 Claims, 4 Drawing Sheets

BUFFERED NITROGENATED CARBON OVERCOAT FOR DATA RECORDING DISKS AND METHOD FOR MANUFACTURING THE SAME

This application is a division of application Ser. No. 08/608,392, filed Feb. 28, 1996, now U.S. Pat. No. 5,855,746.

BACKGROUND OF THE INVENTION

1. Field of the Invention

This invention relates generally to the manufacture of data recording media and particularly to the manufacturing of durable recording medium surfaces for high performance disk drives.

2. Description of the Related Art

Magnetic recording media on disk drives typically consist of thin film magnetic alloys deposited on a disk. In hard disk technology, the disk is usually an aluminum disk with a surface prepared to receive the magnetic alloy thin film. Techniques for depositing the thin film of magnetic alloy include electrolytic or electroless plating from aqueous solutions, or more commonly in current technology glow-discharge sputter-deposition processes. To improve the durability of the thin film magnetic alloy, existing technologies include depositing a thin film of hard overcoat material over the alloy, either directly on the magnetic alloy, or with intervening layers used for adhesion or for other purposes. Typically, the overcoat material in recently manufactured disk drives consists of amorphous carbon or hydrogenated carbon. The overcoat provides a hard, wear resistant layer that protects the disk from contact with the read/write head during start and stop operations, and in other transient contact situations.

As consumers demand software with ever increasing features and capabilities, the need for additional disk storage becomes more pressing. Space and weight limitations on portable and desktop computers require disk drive manufacturers to rely on higher data densities as one way to address this need. However, higher data densities impose new challenges on the disk drive maker.

As the data density increases on disk drives, the flying height for the read/write heads used with the disk is becoming lower and lower, and the bit cell size is becoming smaller and smaller. The lower flying heights tend to cause greater wear on the disk surface, and reduce the reliability and useful life of the disk. The small bit cell sizes increase demands on the magnetic performance of the recording medium.

To provide more durable disks to accommodate the lower flying heights, nitrogenated carbon overcoats have been developed. See, for example, U.S. Pat. No. 5,453,168, by Nelson et al., entitled Method for Forming Protective Overcoatings for Metallic-Film Magnetic-Recording Mediums, which discusses a problem of adhesion of wear resistant protective overcoats to magnetic alloys, and provides a good discussion of the deposition technologies used in the magnetic recording disk industry. Nelson, et al. characterize their invention as two layers of sputtered material on cobalt-alloy metallic-film magnetic disks, in which the first layer is an interfacial adhesion layer of sputtered titanium or related material, and the second layer is preferably sputtered titanium diboride or sputtered amorphous nitrided carbon.

Published studies concerning the properties of amorphous carbon nitride coatings, include the Li et al., "Composition, Structure and Tribological Properties of Amorphous Carbon Nitride Coatings", *Surface and Coatings Technology*, 68/69 (1994), pages 611–615; Li et al., "Nano-Indentation Studies of Ultra High Strength Carbon Nitride Thin-Films", J. Appl. Phys. 74 (1), 1 Jul. 1, 1993, pages 219–223; and Li et al., "Infra-Red Absorption and Nuclear Magnetic Resonance Studies of Carbon Nitride Thin Films Prepared by Reactive Magnetron Sputtering", J. Vac. Sci. Technol. A 12 (4), July/August, 1994, pages 1470–1473.

Thus nitrogenated carbon has been reported to produce films that perform very well in terms of hardness, smoothness, and other properties. On the other hand, the presence of nitrogen in the sputter chamber during deposition of the magnetic alloy, has been discovered to cause reduction in coercivity (See, Kahn, et al., "Effects of Nitrogen, Oxygen and Air on the Magnetic Properties of Sputtered CoCrTa Thin Film Recording Discs", IEEE Transactions on Magnetics, Vol. 24, No. 6, November 1988). Even if nitrogen is introduced only into the carbon deposition chambers used for depositing the overcoat, while injecting pure argon or other optimized gas into the deposition chamber for the magnetic alloy, a reduction in coercivity has been observed. The reduction in magnetic coercivity may be due to contamination of the deposition chamber used for the magnetic alloy by excess nitrogen which is carried over from the carbon deposition chamber or chambers, or contamination of the magnetic alloy due to chemical or physical migration from the nitrogenated carbon layer. Alternatively, stresses between the nitrogenated carbon film and the underlying magnetic film may be responsible for the effect.

The reduction in coercivity caused by nitrogen causes increased susceptibility to "self-demagnetization" effects, particularly in high density disks. In high density disks, small bit cell sizes are required. However, the small bit cell size results in transitions in magnetic polarity which are very close together. These close together transitions tend to cause "self-demagnetization". To counteract self-demagnetization, higher coercivity is required for the magnetic media to be used. Thus, if nitrogenated carbon is to be successfully used in high density disk drives, then a solution to the problem of reduced coercivity caused by the nitrogen is required for high density applications.

In summary, nitrogenated carbon overcoats offer some tantalizing properties to designers of high density disk drives. On the other hand, nitrogen has been demonstrated to have deleterious effects on magnetic films. If these negative effects are ignored, the manufacturer risks lower yield, especially in high density products. Lower yields in turn result in higher per disk manufacturing costs.

Thus, it is desirable to increase the durability of the magnetic recording medium on disks, without reducing the magnetic performance, to accommodate both greater data density and longer life for disk drives.

SUMMARY OF THE INVENTION

This invention reaps the benefits of nitrogenated carbon as an overcoat material, while reducing the negative impact on recording performance suffered in the prior art. Thus, this invention can be characterized as a method for manufacturing a hard disk that includes forming a data recording layer on the disk, forming a nitrogenated carbon overcoat layer over the data recording layer, (with or without intervening layers), and processing data recording layer to protect it from the nitrogen used in the process of forming the nitrogenated carbon. In one approach, the step of processing the data recording layer to protect it from nitrogen is accomplished by forming a buffer layer between the data recording layer and the overcoat layer by depositing a layer including carbon on the data recording layer using a carbon deposition process excluding nitrogen, then forming the overcoat layer by depositing carbon on the buffer layer using a carbon deposition process that includes a nitrogen source. In an alternative, the step of processing the data recording layer to protect it from nitrogen is accomplished with or without a buffer layer by preventing contamination of magnetic alloy data recording layer deposition process by nitrogen used in the overcoat layer deposition step in an automated process by transferring the disk after data recording layer deposition into an isolation chamber that has no nitrogen, and then into a nitrogenated carbon deposition chamber.

According to one aspect of this invention, the technique for depositing the overcoat layer includes sputtering. According to this aspect, the invention can be characterized as a method for manufacturing a magnetic recording medium including steps of: forming a layer of magnetic alloy on a disk; sputtering carbon on the magnetic alloy in a first ambient environment excluding nitrogen to form a buffer layer; and sputtering carbon on the buffer film in a second ambient environment including nitrogen to form a nitrogenated carbon layer. The second ambient environment includes nitrogen having a proportion less than 40 atomic percent, and preferably in the interval from 35–20 atomic percent, particularly when the magnetic layer comprises cobalt, such as cobalt alloy, like cobalt, chromium, tantalum. Furthermore, in one enhancement of this invention, the first ambient environment in which the buffer layer is formed includes a hydrogen gas, a hydrocarbon gas such as alkanes or alkenes, or another hydrogen source, so that the buffer layer comprises a hydrogenated carbon film.

In an automated embodiment, the technique of this invention includes the following steps:

sputtering a magnetic layer comprising cobalt on a disk surface of a disk in a first chamber;

moving the disk from the first chamber to a second chamber;

sputtering carbon on the magnetic layer in an ambient environment, optionally including a hydrogen source, and excluding nitrogen in the second chamber to form a buffer layer;

moving the disk from the second chamber to a third chamber; and sputtering carbon over the buffer layer in an ambient environment including nitrogen, in a proportion of less than 40 atomic percent, to form a nitrogenated carbon layer in the third chamber.

According to another embodiment, the technique includes a process for forming the nitrogenated carbon layer in two or more stages. Thus, after forming the first layer of nitrogenated carbon, the method includes moving the disk from the third chamber to a fourth chamber (and fifth, if necessary) in which carbon is sputtered over the first layer of nitrogenated carbon in an ambient environment including nitrogen.

This invention can also be characterized as a magnetic recording surface on a substrate for use in a disk drive. The magnetic recording surface includes a magnetic medium film on the substrate, a buffer film over the magnetic medium film, and a nitrogenated carbon film over the buffer film. The nitrogenated carbon film preferably consists of amorphous $N_xC_y$, where x and y are variables depending on deposition processes, and the like. The thickness of the nitrogenated carbon film, for example, lies in an interval from 5 to 15 nanometers. The buffer film comprises a carbon film excluding nitrogen, such as a hydrogenated carbon film having a thickness, for example, in an interval from 1 to 7 nanometers.

According to another aspect of this invention, in an automated environment, after depositing the magnetic data recording layer preferably by a sputtering process, the disk is moved to an isolation chamber with a neutral ambient environment excluding nitrogen, and then to a chamber for depositing, preferably by sputtering, the nitrogenated carbon overcoat layer. The use of the isolation chamber appears to prevent cross-contamination between the chamber used for depositing the magnetic data recording layer, and the chamber used for depositing nitrogenated carbon, such that improved coercivity is achieved in the resulting disk.

This invention is particularly well-suited to the manufacturing of magnetic recording medium overcoat layers for disk drive media. Because, in high throughput automated manufacturing lines, carbon overcoats typically require 2 or 3 sequential deposition steps, it is possible to use different gas mixtures at each of the carbon deposition stages, or to use an isolation chamber before the nitrogenated carbon deposition chamber. In the embodiment using a buffer layer, a first layer of carbon is sputtered directly onto the fresh layer of magnetic alloy without added nitrogen in a first carbon deposition stage. This results in less cross-contamination between the magnetic alloy deposition stage and its nearest neighboring nitrogenated carbon stage. A second carbon layer is then sputtered in the presence of an optimum partial pressure of nitrogen. A third carbon layer (and fourth, if necessary) may be added as well, sputtered in the presence of an optimum partial pressure of nitrogen.

The process of this invention removes nitrogen from the chamber that is in closest proximity to the deposition chamber used for the magnetic alloy, and thereby reduces the possibility of cross-contamination of gases. In addition, the buffer layer, which is in contact with the magnetic layer, is non-nitrogenated, which essentially eliminates any adverse interaction, such as due to chemical or physical migration of nitrogen between the magnetic layer and the nitrogenated carbon layer.

Thus, a novel approach is provided to overcome the problem of reduced coercivity in magnetic media having nitrogenated carbon overcoats, while retaining the mechanical and improved surface topographical properties of nitrogenated carbon overcoats.

This invention makes it possible to manufacture magnetic recording disks with high yield that achieve the coercivity of today's high density data storage devices, while taking advantage of the improved reliability and useful lifetime achieved using the tough nitrogenated carbon overcoats.

Other aspects and advantages of this invention can be seen upon review of the drawings, the detailed description, and the claims that follow.

DETAILED DESCRIPTION OF THE PREFERRED EMBODIMENTS

Figure 1:
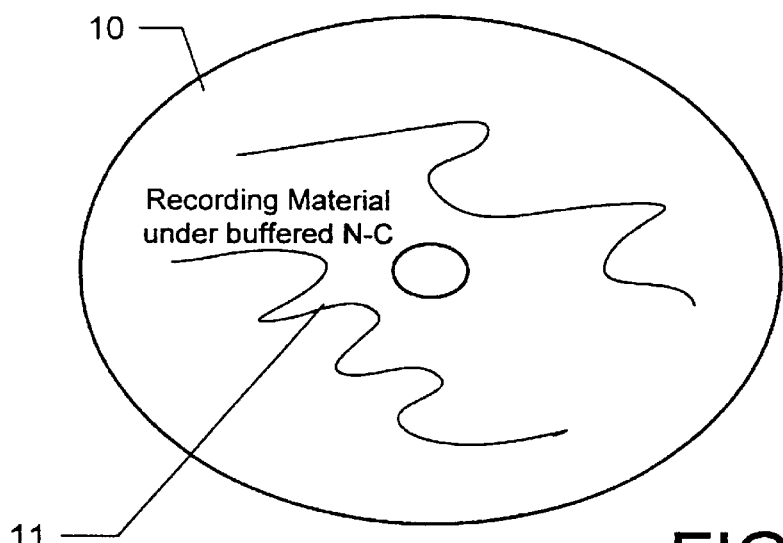
FIG. 1 is a perspective view of a data recording disk, including a recording medium layer, a buffer layer and a nitrogenated carbon layer according to this invention.

Preferred embodiments of this invention are now described with reference to the figures. FIG. 1 provides a perspective view of a data recording disk 10 having a recording surface 11, which consists for magnetic recording of a layer of magnetic alloy under a nitrogenated carbon overcoat layer. The disk 10 shown in FIG. 1 is intended to represent a hard disk used in a hard disk drive. This invention can be applied to other recording media rigid enough for nitrogenated carbon overcoat layers.

Figure 2:
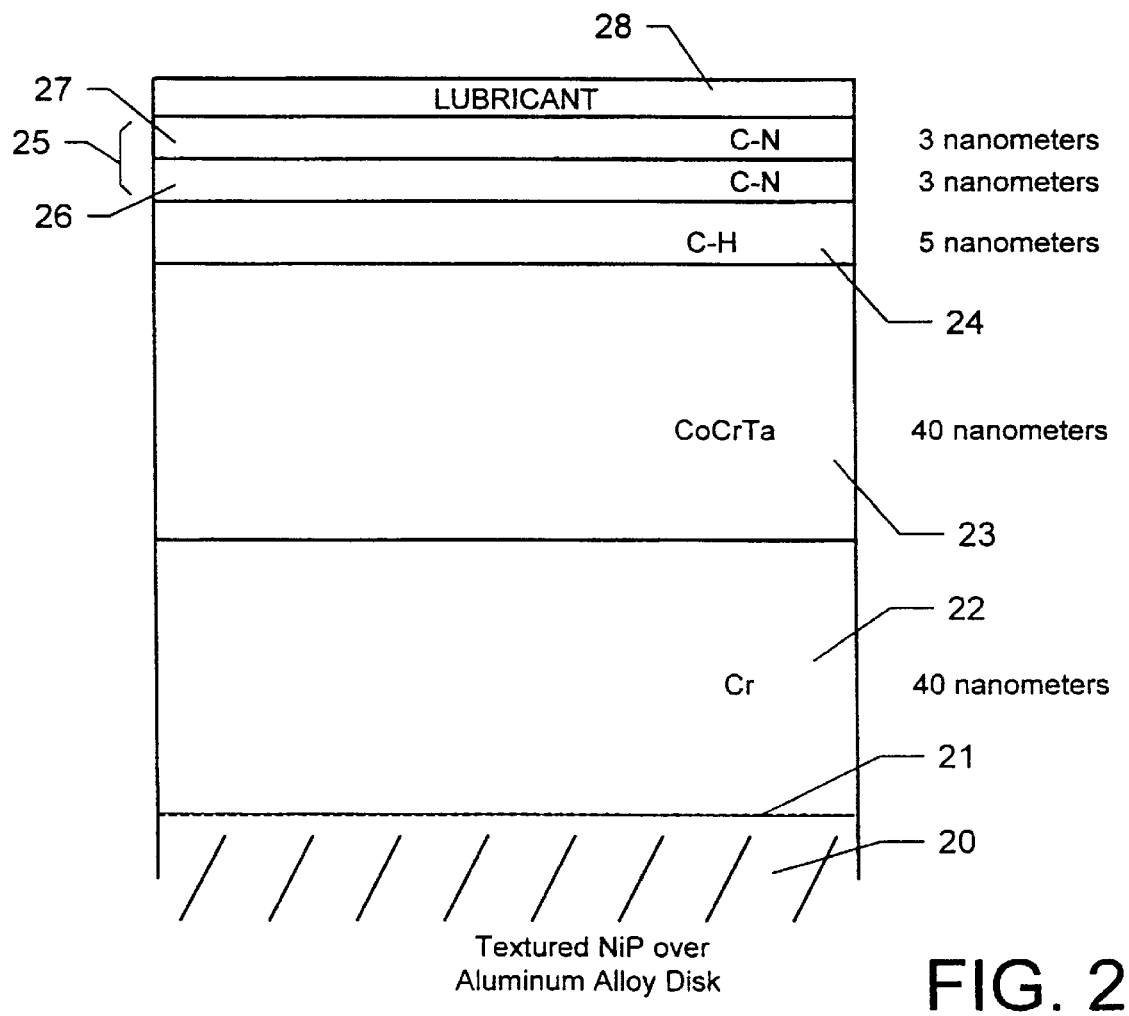
FIG. 2 is a schematic cross-section of a magnetic recording medium including the nitrogenated carbon overcoat layer of this invention.

FIG. 2 provides a schematic cross-section of a magnetic recording hard disk with an overcoat layer of nitrogenated carbon. Thus, the magnetic recording hard disk includes an aluminum alloy disk 20, having a plated nickel-phosphorous coating over the aluminum alloy. This coating is typically texturized to control the friction of magnetic read/write heads during contact with the magnetic medium. Thus, the texturized surface of the nickel-phosphorous layer is represented by the dashed line 21. Over the texturized surface 21, a chromium layer 22 is formed, having a thickness of 30 to 150 nanometers in one embodiment. On top of the chromium layer, a magnetic medium layer 23 is formed, having a thickness, in the range of 10 to 60 nanometers, and 40 nanometers in the example shown in FIG. 2.

Over the magnetic medium layer 23, a buffer layer 24 is formed, having a thickness, for example, of 1 to 7 nanometers, and 5 nanometers in the example shown in FIG. 2. Over the buffer layer 24, a nitrogenated carbon layer 25 is formed in one, two or more stages. In the example shown in the FIG. 2, a two-stage process is used, resulting in a first layer 26 having a thickness in the interval from 1 to 5 nanometers, 3 nanometers in the example shown, and a layer 27 having a thickness in the interval from 1 to 5 nanometers, 3 nanometers in the example shown. Over the nitrogenated carbon layer 25, a lubricant layer 28 is formed having a thickness in the neighborhood of 1 to 5 nanometers.

The lubricant in layer 28, according to one embodiment of this invention, includes about 3 nanometers of Fomblin Z-dol, manufactured by Mont Edison in Italy.

In the example illustrated in FIG. 2, the magnetic medium layer consists of an alloy of cobalt, chromium, and tantalum. Other cobalt-based alloys, such as cobalt/chromium/platinum, may be used. Also, other magnetic materials or other data recording materials can be used beneficially with this invention.

According to this invention, the nitrogenated carbon layer 25 is formed over the magnetic medium layer 23, with an intermediate layer 24 formed between. As shown in FIG. 2, the intermediate layer 24 preferably consists of a hydrogenated carbon, or a pure carbon film, to buffer the nitrogen in the nitrogenated carbon layer 25 from the magnetic medium layer 23. Other suitable buffer materials could be used, so long as they do not adversely affect the performance of the recording film, or of the nitrogenated carbon film, and so long as they operate to prevent contamination of the magnetic medium layer 23 by nitrogen from the nitrogenated carbon layer 25.

Figure 3:
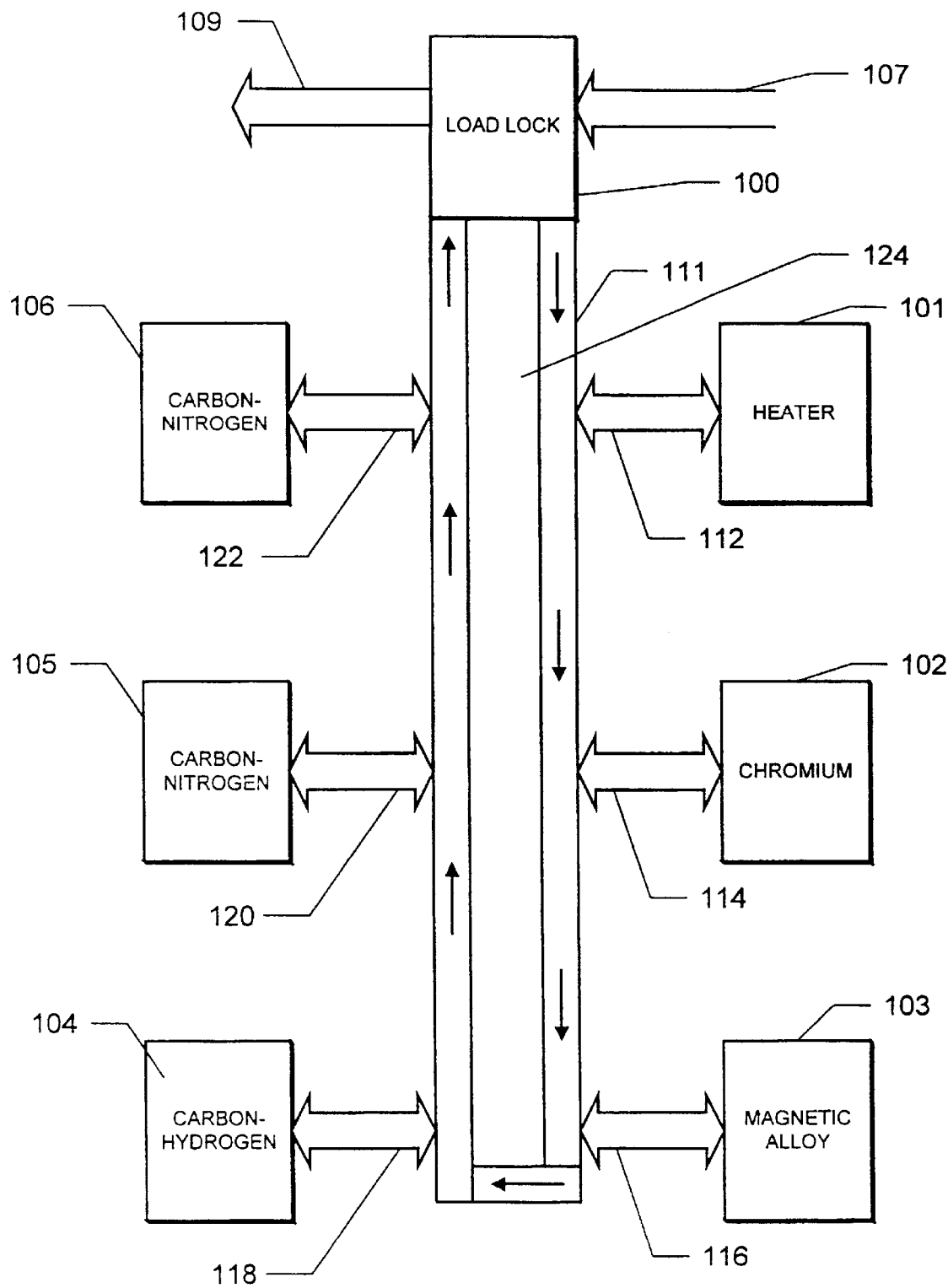
FIG. 3 is a schematic diagram of an automated manufacturing line for manufacturing magnetic medium surfaces on disks according to this invention.

FIG. 3 illustrates an automated manufacturing line suitable for use in manufacturing hard disks according to this invention. The diagram schematically illustrates one of a variety of commercially-available systems, such as, for example, the model MDP 400 sputtering system available from Intevac, of Santa Clara, Calif.

As can be seen, the manufacturing line of FIG. 3 includes a load lock 100, a first process chamber 101, a second process chamber 102, a third process chamber 103, a fourth process chamber 104, a fifth process chamber 105, and a sixth process chamber 106. The load lock 100 is coupled to an input conveyor 107, which transports cassettes of disks to be processed in the line. Also, the load lock 100 includes an output conveyor 109, which transports cassettes to which finished disks are supplied to further processing steps. Load lock 100 is coupled to a conveyor system 111, such as a walking beam or other conveyor technology within a main chamber 124. Conveyor system 111 is coupled to the first process chamber 101 through port 112. Port 112 has seals to isolate process chamber 101 from the main chamber 124. In the manufacturing line of this invention, process chamber 101 is used as a heating stage.

The second process chamber 102 is coupled to the conveyor 111 by port 114. The chamber 102 is set up for sputtering chromium on the disks.

The third process chamber 103 is coupled to the conveyor 111 by port 116. The chamber 103 is set up for sputtering the magnetic alloy on the disks.

The fourth process 104 is connected to the conveyor 111 by port 118. This chamber is set up for sputtering a buffer layer, preferably carbon or hydrogenated carbon, on the disks.

The fifth chamber is connected to the conveyor 111 by port 120. This chamber is set up for sputtering nitrogenated carbon on the disks.

The final chamber 106 is connected to the conveyor 111 by port 122. This chamber is set up for sputtering nitrogenated carbon on the disks in a manner similar to that of chamber 105.

Figure 4:
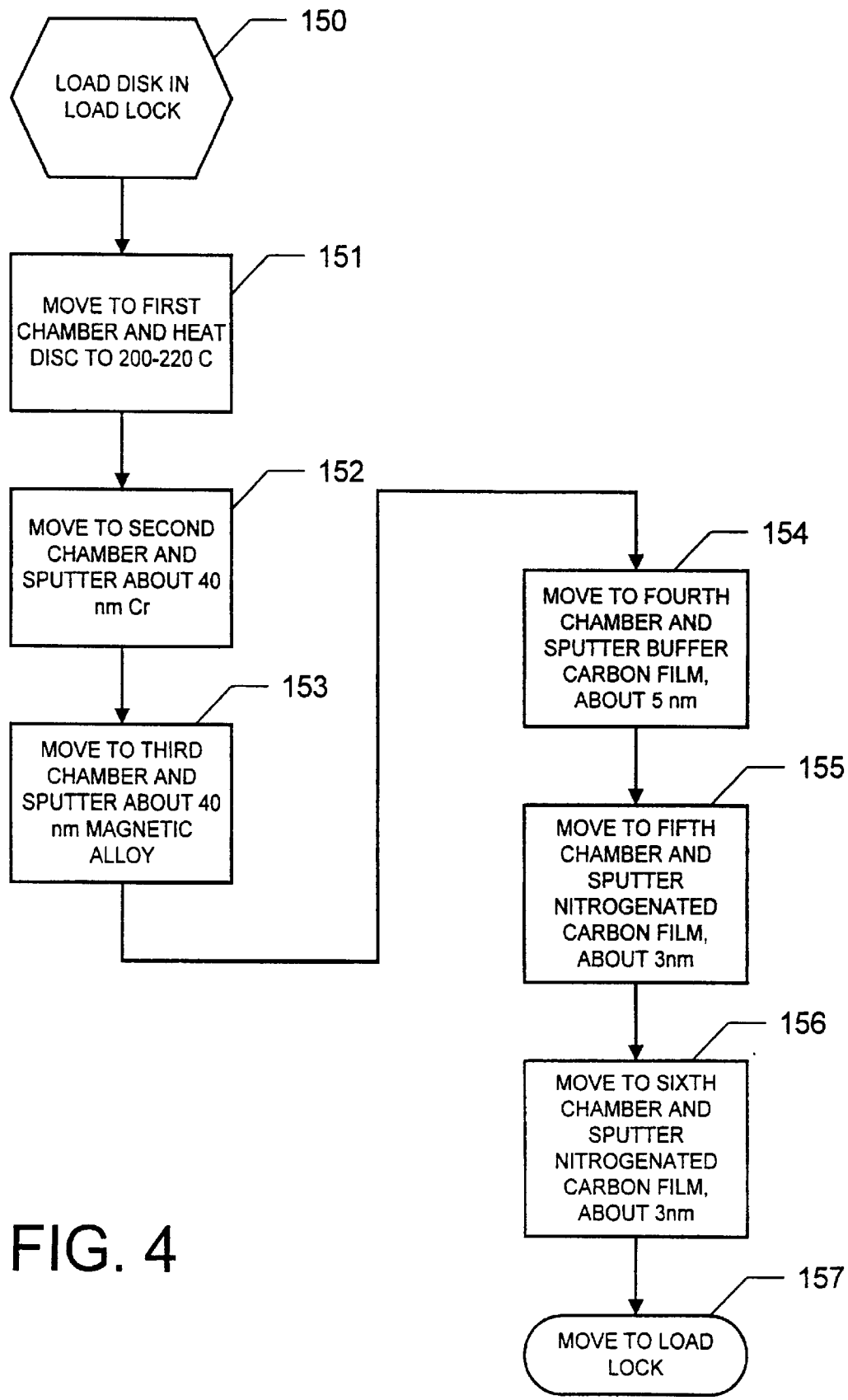
FIG. 4 is a flow chart illustrating the process of manufacturing a magnetic medium surface according to this invention.

The process of manufacturing the hard disks according to one application of this invention in the system of FIG. 3, can be understood with reference to the flow chart of FIG. 4. The process begins when a disk is loaded into the load lock as represented by a block 150. The disk, at this stage, consists of the plated texturized disks without the chromium underlayer (e.g. without layer 22 of FIG. 2) formed thereon. These disks are each moved into the first chamber 101, where each disk is heated to a temperature in the interval from 200° C. to 220° C. (step 151). Next, the disk is moved to the second chamber, where about 40 to 50 nanometers of chromium is sputtered onto the disk to provide a chromium underlayer (step 152). In the next step, the disk is moved to the third chamber, where the magnetic alloy is sputtered over the disk surface formed by the chromium underlayer to a thickness of 40 to 50 nanometers (step 153). In one preferred system, the magnetic alloy comprises cobalt, chromium, tantalum in the respective proportions of 84 percent, 10 percent and 6 percent. Other cobalt/chromium alloys may be used, such as alloys including cobalt, chromium, and various combinations of tantalum, platinum, boron, and nickel. Also, other magnetic alloys, such as cobalt/nickel based alloys, possibly including platinum and other elements, may be used with this invention. Also, this invention may be applied to other types of recording media.

After deposition of the magnetic alloy (step 153), the disk is moved into the fourth chamber 104. In the fourth chamber, buffer carbon is sputtered on the magnetic alloy, in one preferred embodiment to a thickness of about 5 nanometers (step 154). The buffer carbon consists of pure carbon, or preferably, hydrogenated carbon, depending on the needs of the particular implementation. Hydrogenated carbon is sputtered in an ambient including a hydrogen gas, hydrocarbon gases like alkanes or alkenes or another hydrogen source.

In an alternative system, the fourth chamber 104 is not used for deposition. Rather, it is used as an isolation stage to prevent contamination of the chamber 103 with nitrogen used in the nitrogenated carbon sputtering steps in subsequent chambers. This appears to prevent cross-contamination of the magnetic alloy deposition chamber 103 with nitrogen from the subsequent chambers 105, 106. The cross contamination occurs due to gases transferred through the common chamber 124 of the automated line. Gases leak into the common chamber during the opening and closing of gates into the process chamber, and because of the speed of operation insufficient time is allowed between steps to completely remove the gases. Thus, cross-contamination is reduced by increasing the distance between the sources of the leaked gases. Also, in the preferred system, a pump (not shown) is positioned between the fourth chamber 104 and the fifth chamber 105, which serves to getter gases (including nitrogen) leaking from the fifth chamber before the gases can travel to the third chamber 103 and contaminate the magnetic alloy deposition process.

After the processing in the fourth chamber 104, the disk is moved to the fifth chamber 105, and nitrogenated carbon is sputtered over the buffer layer (step 155). In a preferred embodiment, this nitrogenated carbon is formed to a thickness of about 3 nanometers. Next, the disk is moved to the sixth chamber, and nitrogenated carbon is sputtered again over the disk to a thickness of about 3 nanometers (step 156). After processing in the sixth chamber, the disk is moved out to the load lock as represented by step 157. After receipt by the load lock 100, the disk is placed into a cassette on exit conveyor 109, and transported on to a process for applying lubricant to the disk.

In one example implementation of the magnetic recording surface of this invention, the fourth chamber 104 in the MPD 400 system is operated at about 18 watts/cm$^2$ for about 7 seconds, with a carbon target with an ambient environment including about 20 atomic percent hydrogen gas and 80 atomic percent argon gas at a pressure of 3–20 millitorr. A range of powers for deposition of the hydrogenated carbon film in a preferred system is in the interval of 12 to 19 watts/cm$^2$ for a time period of 5 to 8 seconds. This results in a hydrogenated carbon thickness of about 5 nanometers.

Processing in the fifth chamber 105, and in the sixth chamber 106, is carried out with about 18 watts/cm$^2$ of power for 5 to 7 seconds, each with a carbon target. The ambient in the fifth and sixth chambers includes about 20 atomic percent nitrogen and 80 atomic percent argon at a pressure of 3–20 millitorr. The range of powers for deposition of a nitrogenated carbon is from 12 to 19 watts/cm$^2$ for 5 to 8 seconds. This results in deposition of 3 to 5 nanometers of nitrogenated carbon in each chamber for a total thickness of 6 to 10 nanometers of nitrogenated carbon.

In the steps involving deposition of nitrogenated carbon, it is preferable to have an ambient environment including less than 40 atomic percent nitrogen, and preferably nitrogen in the interval between 40 and 15 atomic percent. More preferably, according to testing on an alloy including cobalt and chromium, the ambient for deposition of nitrogenated carbon includes nitrogen in the interval from 35 to 20 atomic percent. If the concentration of nitrogen is too low, the durability of the nitrogenated film is reduced. However, too great a concentration of nitrogen appears to result in less resistance to corrosion of the magnetic recording surface.

Figure 5:
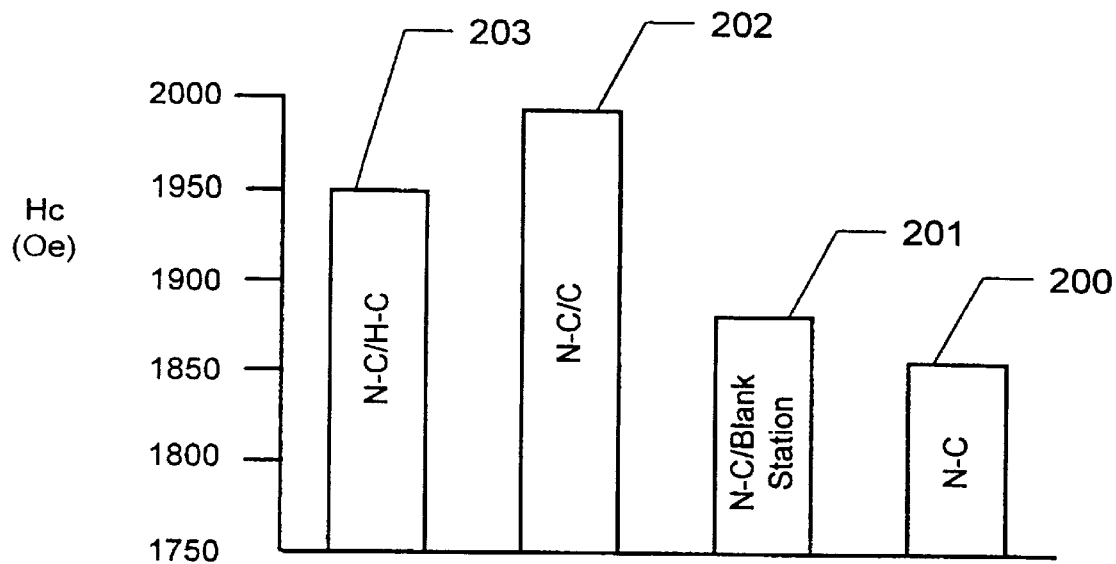
FIG. 5 is a chart demonstrating performance improvements in tested samples, made using the techniques of this invention.

FIG. 5 is a chart illustrating the improved magnetic coercivity of nitrogenated carbon films processed according to this invention. The vertical axis of the chart shows coercivity in Oersteds. The bars represent the measured coercivity for nitrogenated carbon overcoated media. Bar 200 illustrates performance of a disk in which the nitrogenated carbon is formed directly on the magnetic medium without an isolation stage or a buffer layer. Bar 201 shows performance when the nitrogenated carbon is formed after an isolation stage, which appears to prevent cross-contamination of gases between the magnetic alloy sputtering chamber and the nitrogenated carbon sputtering chamber. Bar 202 illustrates the coercivity of resulting structure where a buffer layer consisting of carbon sputtered in an argon ambient environment under a nitrogenated carbon overlayer is formed. Bar 203 illustrates the measured results with a hydrogenated carbon buffer layer.

Thus, the average coercivity of the film having nitrogenated carbon in contact with the magnetic film, is about 1,850 Oersteds (bar 200) in this example. Where an isolation stage is used between the nitrogenated carbon and the magnetic alloy, the average coercivity is about 1,880 Oersteds (bar 201). Where a pure carbon buffer film is used, as represented by bar 202, the average coercivity is about 2,000 Oersteds. When the hydrogenated carbon buffer film is used, the average coercivity is about 1,950 Oersteds, as represented by bar 203.

Thus, according to this invention, significant improvement in magnetic coercivity is achieved by using a buffer layer of carbon or hydrogenated carbon between the magnetic alloy and the nitrogenated carbon. Also, a significant improvement in coercivity is observed when an intermediate empty chamber is scheduled between first and second deposition steps, perhaps by preventing or reducing contamination of the magnetic alloy by the nitrogen from an adjacent sputter chambers.

Figure 6:
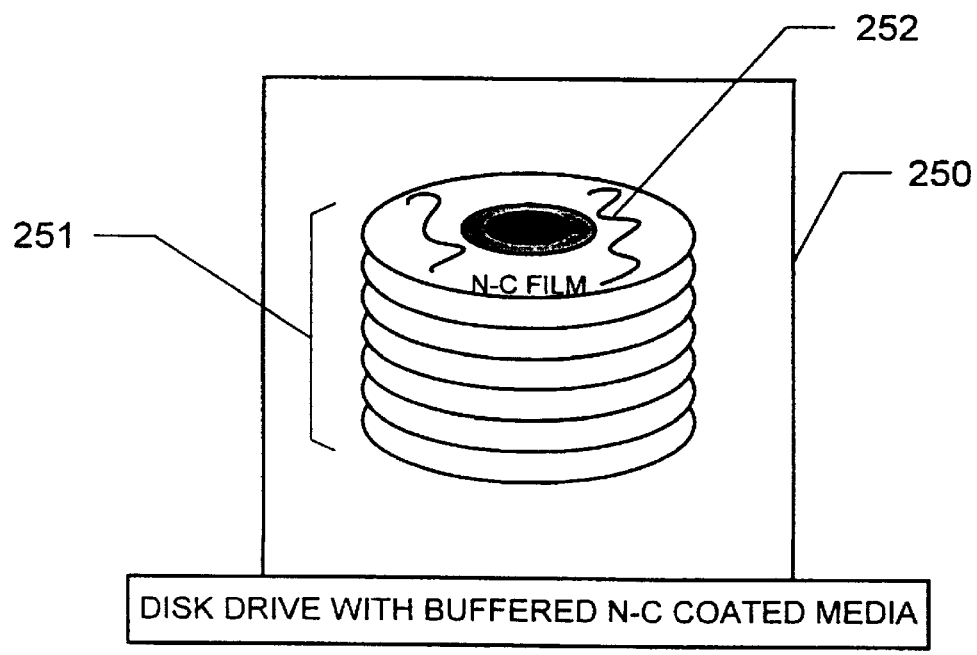
FIG. 6 is perspective view of a disk drive using the buffered nitrogenated carbon overcoat according to this invention.

FIG. 6 illustrates a disk drive, including the nitrogenated carbon coated media according to this invention. Thus, the drive is schematically represented by the box 250, including a stack of magnetic recording disks 251. The surfaces, e.g., surface 252, of all the disks include a nitrogenated carbon film, manufactured in a manner to prevent contamination of the underlying magnetic media with the nitrogen. This allows very durable films to be manufactured with good magnetic performance.

As the data density increases, and the flying height of the read/write heads in the disk drives is reduced, both durability and magnetic performance of the film become more and more important. This invention provides a technique taking advantage of the durability of nitrogenated carbon films, without adversely impacting the magnetic performance of the disk drive.

The foregoing description of a preferred embodiment of the invention has been presented for purposes of illustration and description. It is not intended to be exhaustive or to limit this invention to the precise forms disclosed. Clearly, many modifications and variations will be apparent to practitioners skilled in this art. It is intended that the scope of the invention be defined by the following claims and their equivalents.

We claim:

1. A magnetic disk for a hard disk drive, the magnetic disk comprising:

a substrate;

an underlayer deposited above the substrate;

a magnetic layer deposited above the underlayer;

a hydrogenated carbon buffer layer deposited above the magnetic layer, the buffer layer containing carbon and hydrogen and having a thickness between 1 to 7 nanometers; and a nitrogenated carbon layer deposited directly above the buffer layer, the nitrogenated carbon layer containing carbon and nitrogen.

2. The magnetic disk of claim 1 wherein the nitrogenated carbon layer includes nitrogen in a proportion of less than 40 atomic percent.

3. The magnetic disk of claim 1 wherein the magnetic layer comprises cobalt.

4. The magnetic disk of claim 3 wherein the magnetic layer further comprises chromium and tantalum.

5. The magnetic disk of claim 3 wherein the magnetic layer further comprises nickel.

6. The magnetic disk of claim 3 wherein the magnetic layer further comprises platinum.

7. The magnetic disk of claim 1 wherein the magnetic layer has a thickness between 10 to 60 nanometers.

8. The magnetic disk of claim 1 wherein the nitrogenated carbon layer has a thickness between 1 to 5 nanometers.

9. The magnetic disk of claim 2 wherein the nitrogen has a proportion from 20 to 35 atomic percent.

* * * * *